United States Patent [19]

Matsumoto et al.

[11] Patent Number: 4,635,233

[45] Date of Patent: Jan. 6, 1987

[54] SEMICONDUCTOR MEMORY DEVICE

[75] Inventors: Tetsuro Matsumoto, Tachikawa; Kazuhiko Kajigaya, Kodaira, both of Japan

[73] Assignee: Hitachi, Ltd., Tokyo, Japan

[21] Appl. No.: 649,296

[22] Filed: Sep. 11, 1984

[30] Foreign Application Priority Data

Sep. 12, 1983 [JP] Japan .................................. 58-166635

[51] Int. Cl.⁴ .............................................. G11C 8/00
[52] U.S. Cl. .................................... 365/230; 365/189
[58] Field of Search ........................ 365/189, 230, 233

[56] References Cited

U.S. PATENT DOCUMENTS 4,316,265 2/1982 Tanaka et al. ........................ 365/203
4,482,984 11/1984 Oritani ............................ 365/189 X Primary Examiner—Joseph A. Popek
Attorney, Agent, or Firm—Antonelli, Terry & Wands

[57] ABSTRACT

A semiconductor memory device has three address decoder circuits that select word lines. Since the word lines are selected by the three address decoder circuits, it is allowed to reduce the number of unit decoder circuits that constitute the address decoder circuits. Therefore, the load for the address buffer circuit can be reduced, and operation can be carried out at high speeds. Further, the decrease in the number of unit decoder circuits results in the decrease in the consumption of electric power.

23 Claims, 10 Drawing Figures

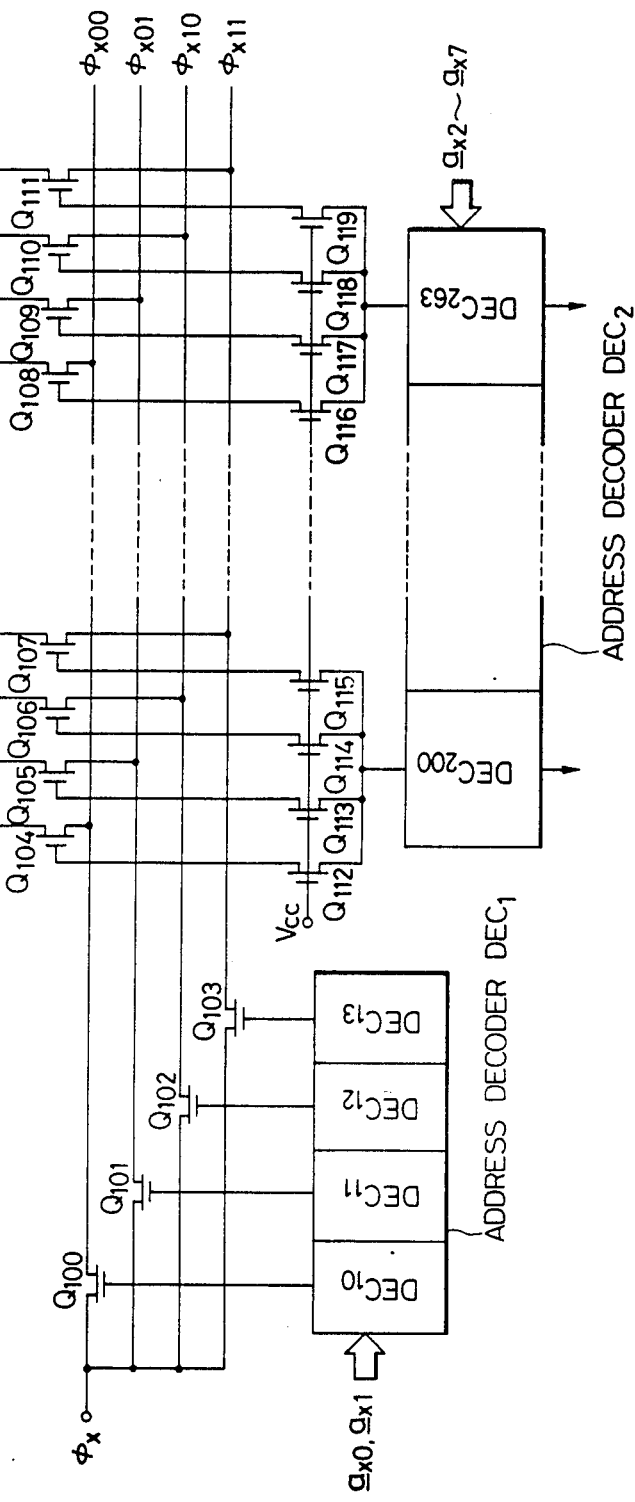

SEMICONDUCTOR MEMORY DEVICE

BACKGROUND OF THE INVENTION

The present invention relates to a semiconductor memory device (hereinafter referred to as memory), and particularly to a technique that can be effectively adapted to, for example, a dynamic random access memory (hereinafter referred to as dynamic RAM) having a large storage capacity.

A dynamic RAM has memory arrays consisting of a plurality of memory cells, and address decoder circuits for selecting memory cells that are designated by address signals out of the memory arrays.

In the dynamic RAM, each memory cell consists of an insulated gate field effect transistor (hereinafter referred to as MOSFET) and a capacitor. Since the memory cell is made up of a relatively small number of elements, it is allowed to form many memory cells on a semiconductor chip relatively easily, and to realize a memory having a large storage capacity.

However, increase in the number of memory cells formed on the semiconductor chip results in the increase in the number of elements which constitute an address decoder circuit to select desired memory cells out of the memory array. In other words, an increased area is occupied by the address decoder circuit. The increase in the area occupied by the address decoder circuit imposes a limitation when a memory having a large storage capacity is to be formed on a relatively small semiconductor chip.

FIG. 8 is a diagram of an address decoder circuit that was developed earlier by the inventors of the present invention. The address decoder circuit of FIG. 8 is used for the X system in a dynamic RAM having a storage capacity of, for example, about 256 K (262144) bits.

The dynamic RAM of 256 kilobits is constituted by four memory arrays each having a storage capacity of 64 K (65536) bits. Each of these memory arrays has 65536 memory cells arranged in the form of a matrix, 256 data lines provided for each of the memory cell rows, and word lines provided for each of the memory cell columns. In this case, each of the memory arrays has, for example, 256 data lines and 256 word lines $W_0$ to $W_{255}$.

In the address decoder circuit of FIG. 8, word lines designated by address signals are selected out of 256 word lines, and select signals are supplied to the selected word lines only. Therefore, select signals are supplied from the address decoder circuit to the memory cells that are to be selected.

Further, the address decoder circuit is commonly used for the two memory arrays. Therefore, the above-mentioned dynamic RAM of 256 kilobits is provided with two address decoder circuits shown in FIG. 8. The address decoder circuit has a first address decoder circuit $DEC_1$ and a second address decoder circuit $DEC_2$.

The first address decoder circuit $DEC_1$ consists of four unit address decoder circuits $DEC_{10}$ to $DEC_{13}$, receives complementary address signals $ax0$, $ax1$ and decodes them. Among the MOSFET's $\bar{Q}_{100}$ to $Q_{103}$, therefore, a MOSFET designated by the complementary address signals $ax0$, $ax1$ is selected. Therefore, a select timing signal is selectively formed from the four select timing signals $\phi_{x00}$ to $\phi_{x11}$. Namely, 64 word lines are selected out of 256 word lines. A word line is selected by the second address decoder circuit $DEC_2$ out of the above-selected 64 word lines. That is, the second address decoder circuit $DEC_2$ decodes complementary address signals $ax2$ to $ax7$, receives through its one terminal the select timing signal formed respective to the decoded signal, and produces an output from the other terminal thereof to turn on a MOSFET that is coupled to a word line which is to be selected. Therefore, the select timing signal is transmitted only to a word line that is to be selected. The second address decoder circuit $DEC_2$ consists of 64 unit address decoder circuits $DEC_{200}$ to $DEC_{263}$ to select a word line out of 64 word lines. Since the unit address decoder circuits are required in such a large number, the electric power is consumed in relatively large amounts.

The above-mentioned complementary address signal $an$ consists of a pair of internal address signals, i.e., consists of an internal address signal $an$ which is substantially in phase with an external address signal $An$ supplied from an external unit, and an internal address signal $\bar{an}$ which is substantially inverted in phase relative to the external address signal $An$. Therefore, the complementary address signal $ax0$ consists of an internal complementary address signal $ax0$ and an internal address signal $\overline{ax0}$ which is inverted in phase relative thereto. In the following description, therefore, the address signals are expressed in the above-mentioned manner.

The internal complementary address signals $ax0$ to $ax7$ are formed by an address buffer circuit which is not diagrammed. The internal complementary address signals $ax2$ to $ax7$ are supplied to relatively many number of unit address decoder circuits as mentioned above. Therefore, the load of address buffer circuit increases. Consequently, the address buffer circuit requires a relatively extended period of time to form internal complementary address signals, and operation speed of the dynamic RAM decreases.

MOSFET's $Q_{100}$ to $Q_{119}$ shown in FIG. 8 are all of the n-channel enhancement-type. In the following description, MOSFET's will be all of the n-channel enhancement-type unless stated otherwise.

SUMMARY OF THE INVENTION

The object of the present invention is to provide a semiconductor memory device which operates at high speeds.

Another object of the present invention is to provide a semiconductor memory device which consumes reduced amounts of electric power.

A further object of the present invention is to provide a semiconductor memory device which features simplified circuit structure.

The above and other objects as well as novel features of the present invention will become obvious from the description of the specification and the accompanying drawings.

BRIEF DESCRIPTION OF THE DRAWINGS

FIG. 7 is a circuit diagram showing an address buffer circuit X-ADB;

FIG. 8 is a circuit diagram showing an address decoder circuit that was developed by the inventors of the present invention prior to the present invention.

DESCRIPTION OF THE PREFERRED EMBODIMENTS

Figure 1:
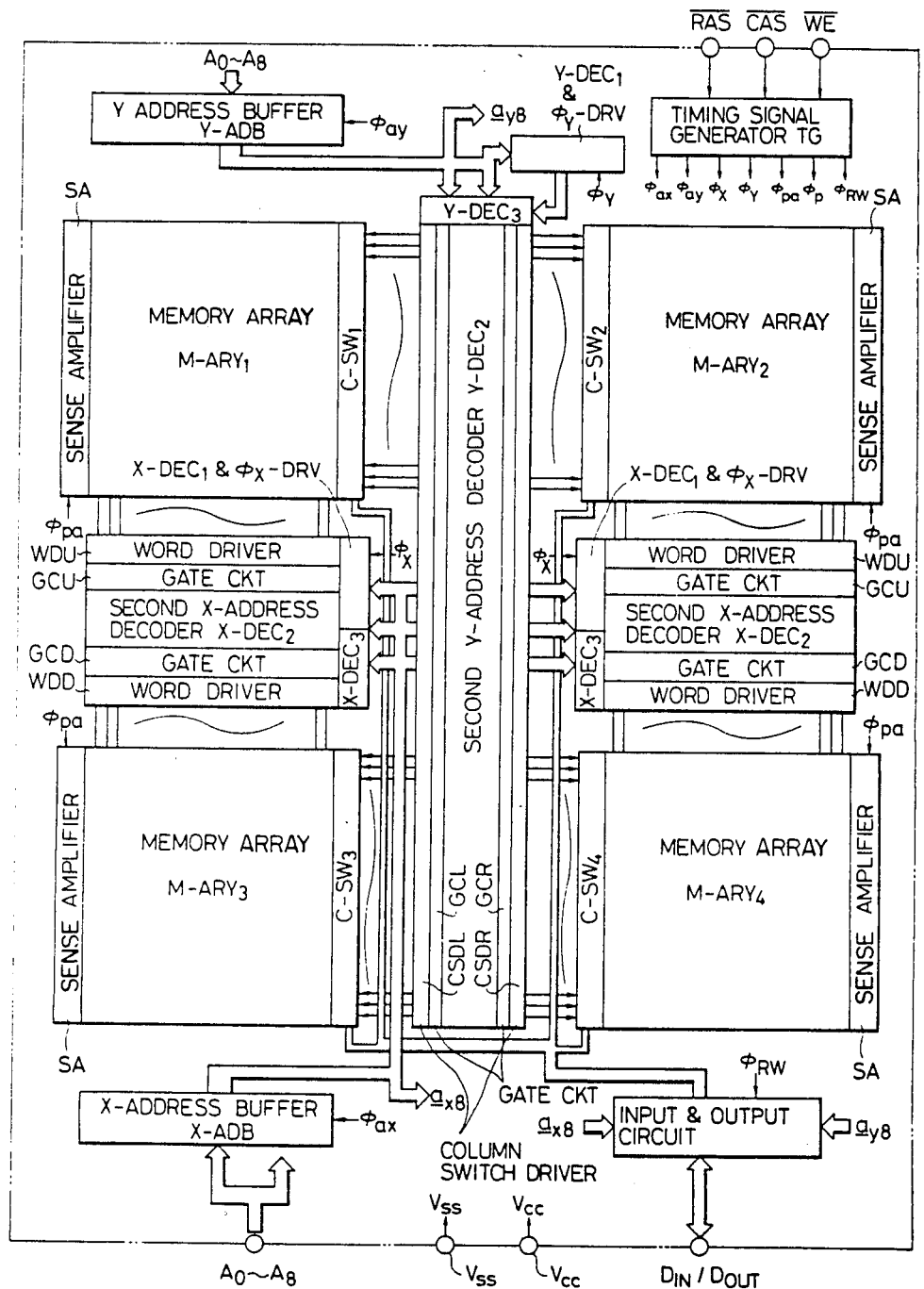
FIG. 1 is a block diagram showing an embodiment of a dynamic RAM to which the present invention is adapted.

FIG. 1 is a block diagram of a dynamic RAM to which the present invention is adapted. In FIG. 1, the circuit blocks surrounded by a dot-dash line are formed on a semiconductor substrate by a known technique of semiconductor integrated circuit. In FIG. 1, furthermore, the main circuit blocks are described in a manner that they are practically formed on the semiconductor substrate.

In FIG. 1, M-ARY$_1$ to M-ARY$_4$ denote memory arrays each having 65536 memory cells, though there is no particular limitation. Therefore, the dynamic RAM according to this embodiment has a storage capacity of about 256 kilobits. As will be described later in detail with reference to FIG. 2B, a memory cell has a select terminal, an input/output terminal, a MOSFET for selection, and a capacitor for storing data. A control electrode (gate electrode) of the MOSFET for selection is coupled to the select terminal, one electrode of the MOSFET for selection is coupled to the input/output terminal, and the other electrode thereof is coupled to the capacitor for storing data.

In the memory array M-ARY$_1$, the memory cells are arranged in the form of a matrix. As will be mentioned later in detail with reference to FIG. 2A, word lines are formed for the memory cell columns that are constituted by the memory cells, and complementary data lines are formed for the memory cell rows that are constituted by the memory cells. Select terminals of a plurality of memory cells constituting the same memory cell column are coupled to a word line that is provided for the memory cell column. Terminals on one side of the word lines are coupled to output terminals of a word driver WDU.

In the memory array, select terminals of the memory cells to be selected are served with a select signal from the word driver WDU via word lines. Therefore, a memory cell column is selected out of a plurality of memory cell columns constituting the memory array. The data stored in the selected memory cells are transmitted to the corresponding complementary data lines.

A sense amplifier is provided for each of the memory cell rows. The sense amplifier amplifies a signal of the complementary data line of a memory cell row for which the sense amplifier has been provided. Therefore, the data transmitted from the selected memory cell to the corresponding complementary data line, is amplified by the corresponding sense amplifier. In FIG. 1, a plurality of sense amplifiers provided for a memory array are represented by a circuit block SA. Further, although there is no particular limitation, operation of the sense amplifiers is controlled by a timing signal $\phi_{pa}$.

The data amplified by the sense amplifier are transmitted to a column switch C-SW$_1$ which selects data out of the above-mentioned data responsive to signals from a column switch driver CSDL. The selected data are transmitted to an input & output circuit via a complementary common data line.

Although the above description has dealt with the memory array M-ARY$_1$ only, the remaining three memory arrays M-ARY$_2$ to M-ARY$_4$ have also been constructed in the same manner as the memory array M-ARY$_1$. Therefore, the input & output circuit receives data from each of the memory arrays, i.e., receives four data. The input & output circuit has a decoder circuit for decoding the complementary address signals $\overline{ax}8$, $\overline{ay}8$. In the reading operation, a data designated by the complementary address signals $\overline{ax}8$, $\overline{ay}8$ is selected out of the four data, and is produced via an input/output terminal D$_{IN}$/D$_{OUT}$.

In the writing operation, the data supplied to the input & output circuit via the input/output terminal D$_{IN}$/D$_{OUT}$ is transmitted to a complementary common data line designated by the complementary address signals $\overline{ax}8$, $\overline{ay}8$. Therefore, the data is transmitted to a memory array designated by the complementary address signals $\overline{ax}8$, $\overline{ay}8$ among the four memory arrays. The data transmitted to the memory array is transmitted to a complementary data line designated by the column switch driver CSD. The data is then transmitted to a memory cell selected by a select signal from the word driver WD, and is written therein.

Depending upon the potential of timing signal $\phi_{RW}$, the input & output circuit produces the data from the complementary common data line to the input/output terminal D$_{IN}$/D$_{OUT}$ or transmits the data from the input/output terminal D$_{IN}$/D$_{OUT}$ to the complementary common data line.

In FIG. 1, X-ADB denotes an X-address buffer circuit and Y-ADB denotes a Y-address buffer circuit. External address signals A$_0$ to A$_8$ are transmitted to the X-address buffer circuit X-ADB and to the Y-address buffer circuit Y-ADB via external terminals A$_0$ to A$_8$. The X-address buffer circuit X-ADB introduces the external address signals A$_0$ to A$_8$ in synchronism with a timing signal $\phi_{ax}$ to form complementary address signals $\overline{ax}0$ to $\overline{ax}8$ of the X system. Similarly, the Y-address buffer circuit Y-ADB introduces the external address signals A$_0$ to A$_8$ in synchronism with a timing signal $\phi_{ay}$ to form complementary address signals $\overline{ay}0$ to $\overline{ay}8$ of the Y system. The Y-address buffer circuit Y-ADB introduces external address signals at a timing lagged behind the X-address buffer circuit X-ADB. Therefore, the dynamic RAM of this embodiment assumes a so-called address multiplex system.

Though there is no particular limitation, among the complementary address signals $\overline{ax}0$ to $\overline{ax}8$ formed by the X-address buffer circuit X-ADB, the complementary address signals $\overline{ax}0$, $\overline{ax}1$ are supplied to first X-address decoder circuits & select timing signal drivers X-DEC$_1$ & $\phi_x$-DRV, the complementary address signals $\overline{ax}2$ to $\overline{ax}6$ are supplied to second X-address decoder circuits X-DEC$_2$, and the complementary address signal $\overline{ax}7$ is supplied to third X-address decoder circuits X-DEC$_3$. The remaining complementary address signal $\overline{ax}8$ is supplied to the input & output circuit as mentioned earlier.

As will be mentioned later in detail with reference to FIG. 4, the first X-address decoder circuits and select timing signal drivers X-DEC$_1$ & $\phi_x$-DRV receive a word line select timing signal $\phi_x$ and the complementary address signals $\overline{ax0}, \overline{ax1}$, to selectively form a select timing signal.

The second X-address decoder circuit X-DEC$_2$ can be regarded to be made up of a plurality of unit decoder circuits as will be mentioned later with reference to FIG. 3. In this embodiment, a unit decoder circuit is provided for eight word lines. In the embodiment, therefore, the second X-address decoder circuit X-DEC$_2$ is constituted by 32 unit decoder circuits. The second X-address decoder circuits X-DEC$_2$ decode the complementary address signals $\overline{ax2}$ to $\overline{ax6}$, and supply output signals (decoded signals) to the gate circuits GCU and GUD.

Each of the gate circuits GCU and GUD can be regarded to be constituted by a plurality of unit gate circuits as will be described later in detail with reference to FIG. 3. In this embodiment, a unit gate circuit is provided for eight word lines. Therefore, each of the gate circuits is constituted by 32 unit gate circuits like the above-mentioned second X-address decoder circuits X-DEC$_2$.

The individual decoder circuits constituting the second X-address decoder circuits X-DEC$_2$ supply output signals to their corresponding unit gate circuits in the gate circuit GCU, and to their corresponding unit gate circuits in the gate circuit GCD. It can therefore be regarded that a unit decoder circuit is provided for substantially 16 word lines.

The 32 unit decoder circuits decode the complementary address signals $\overline{ax2}$ to $\overline{ax6}$; i.e., a select signal is formed by a unit decoder circuit which is designated by the complementary address signals among the 32 unit decoder circuits. Therefore, only two unit gate circuits to which the select signal is supplied are selected out of 64 unit gate circuits.

The two unit gate circuits selected out of 64 unit gate circuits produce select signals that select four word lines designated by output signals of the third X-address decoder circuits X-DEC$_3$ out of eight word lines.

Each of the word drivers WDU, WDC can be regarded to be constituted by a plurality of unit word drivers. In this embodiment, a unit word driver is provided for eight word lines. Therefore, like the number of unit decoder circuits, each of the word drivers is constituted by 32 unit word drivers. Each unit word driver is provided for each unit gate circuit at a ratio of 1 to 1.

Each unit word driver is served with output signals from a corresponding unit gate circuit, and with output signals from the first X-address decoder circuit & select timing signal driver Y-DEC$_1$ & $\phi_x$-DRV. A unit word driver served with select signals from the unit gate circuit so as to select four word lines, selects a word line designated by the complementary address signals $\overline{ax0}$, $\overline{ax1}$ out of the four word lines, and supplies a select signal thereto.

As mentioned above, among the 256 word lines constituting the memory array M-ARY$_1$, a word line designated by the complementary address signals $\overline{ax0}$ to $\overline{ax7}$ is selected by the address decoder circuits X-DEC$_1$ to X-DEC$_3$, select timing signal driver $\phi_x$-DRV, gate circuit GCU and word driver WDU, that are diagrammed on the left side of FIG. 1. In this case, among the 256 word lines constituting the memory array M-ARY$_3$, a word line designated by the complementary address signals $\overline{ax0}$ to $\overline{ax7}$ is also selected by the address decoder circuits X-DEC$_1$ to X-DEC$_3$, select timing signal driver $\phi_x$-DRV, gate circuit GCD and word driver WDD, that are diagrammed on the left side of FIG. 1. At substantially the same time, furthermore, a word line designated by the complementary address signals $\overline{ax0}$ to $\overline{ax7}$ is selected from each of the memory arrays M-ARY$_2$ and M-ARY$_4$ by the address decoder circuits X-DEC$_1$ to X-DEC$_3$, select timing signal driver $\phi_x$-DRV, gate circuits GCU, GCD, and word drivers WDU, WDD, that are diagrammed on the right side of FIG. 1.

Among the complementary address signals $\overline{ay0}$ to $\overline{ay8}$ formed by the Y-address buffer Y-ADB, the complementary address signals $\overline{ay0}$, $\overline{ay1}$ are supplied to the first Y-address decoder circuit & select timing signal driver Y-DEC & $\phi_Y$-DRV, the complementary address signals $\overline{ay2}$ to $\overline{ay6}$ are supplied to the second Y-address decoder circuit Y-DEC$_2$, and the complementary address signal $\overline{ay7}$ is supplied to the third Y-address decoder circuit Y-DEC$_3$. The remaining address signal $\overline{ay8}$ is supplied to the input & output circuit as mentioned earlier.

Though there is no particular limitation, the first Y-address decoder circuit & select timing signal driver Y-DEC$_1$ & $\phi_Y$-DRV is constructed in the same manner as the above-mentioned first X-address decoder circuit & select timing signal driver X-DEC$_1$, the second Y-address decoder circuit Y-DEC$_2$ is constructed in the same manner as the second X-address decoder circuit X-DEC$_2$, and the third Y-address decoder circuit Y-DEC$_3$ is constructed in the same manner as the third X-address decoder circuit X-DEC$_3$. Further, the gate circuits GCL, GCR are constructed in the same manner as the above-mentioned gate circuits GCU, GCD, and the column switch drivers CSDL, SCDR are constructed in the same manner as the above-mentioned word drivers WDU, WDD.

It can be regarded that the second Y-address decoder circuit Y-DEC$_2$ is constituted by a plurality of unit decoder circuits. In this embodiment, though there is no particular limitation, a unit decoder circuit is provided for 16 pairs of complementary data lines. Therefore, the second Y-address decoder circuit is constituted by 64 unit decoder circuits.

It can further be regarded that each of the gate circuits GCL, GCR are constituted by a plurality of unit gate circuits. Although there is no particular limitation in this embodiment, a unit gate circuit is provided for eight pairs of complementary data lines. Therefore, each of the gate circuits is constituted by 64 unit gate circuits.

The unit decoder circuits constituting the second Y-address decoder Y-DEC$_2$ are corresponded to the unit gate circuits constituting the gate circuit GCL at a ratio of 1 to 1, and are further corresponded to the unit gate circuits constituting the gate circuit GCR at a ratio of 1 to 1. Namely, the output signals of the unit decoder circuits are supplied to the corresponding unit gate circuits in the gate circuit GCL, and to the corresponding unit gate circuits in the gate circuit GCR.

Each of the column switch drivers CSDL, CSDR can also be regarded to be constituted by a plurality of unit column switch drivers. In this embodiment, a unit column switch driver is provided for eight pairs of complimentary data lines. Therefore, each of the column switch drivers consists of 64 unit column switch drivers. Further, the unit column switch drivers are provided for the unit gate circuits at a rate of 1 to 1. Namely, output signals of the unit gate circuits are supplied to the corresponding unit column switch drivers.

Among the 64 unit decoder circuits constituting the second Y-address decoder circuits Y-DEC$_2$, 32 unit decoder circuits are used for the memory arrays M-ARY$_1$, M-ARY$_2$. Therefore, 32 unit gate circuits in the gate circuit GCL corresponding to the above 32 unit decoder circuits, and 32 unit gate circuits in the gate circuit GCR corresponding to the above 32 unit decoder circuits, are also used for the memory arrays M-ARY$_1$, M-ARY$_2$. Further, 32 unit column switch drivers in the column switch driver CSDL corresponding to 32 unit gate circuits in the gate circuit GCL, and 32 unit column switch drivers in the column switch driver CSDR corresponding to 32 unit gate circuits in the gate circuit GCR, are used for the memory arrays M-ARY$_1$, M-ARY$_2$.

The remaining unit decoder circuits, remaining gate circuits and remaining unit column switch drivers, are used for the memory arrays M-ARY$_3$, M-ARY$_4$.

For the purpose of easy explanation, the following description deals with the portions that are to be used for the memory arrays M-ARY$_1$, M-ARY$_2$. The portions used for the memory arrays M-ARY$_3$, M-ARY$_4$ are the same as those used for the memory arrays M-ARY$_1$, M-ARY$_2$.

The 32 unit decoder circuits constituting the second Y-address decoder Y-DEC$_2$ decode the complementary address signals $\overline{ay2}$ to $\overline{ay6}$, and only a unit decoder circuit designated by the complementary address signals forms a select signal among the 32 unit decoder circuits. That is, the second Y-address decoder Y-DEC form select signals to select eight pairs of complementary data lines out of the memory arrays M-ARY$_1$ and M-ARY$_2$.

The thus formed select signals are supplied to unit gate circuits in the gate circuit GCL corresponding to the unit decoder circuits that have formed the select signals, and are supplied to the unit gate circuits in the gate circuit GCR that are also corresponding thereto. The individual gate circuits served with select signals form select signals which select four pairs of complementary data lines designated by the output signals of the second Y-address decoder circuit Y-DEC$_2$ out of eight pairs of complementary data lines. Namely, the individual unit gate cirsuits produce select signals to select four pairs of complementary data lines designated by the complementary address signal $\overline{ay7}$ out of eight pairs of complementary data lines.

Select signals produced by the unit gate circuits in the gate circuit GCL are supplied to the corresponding unit column switch drivers in the column switch driver CSDL. Similarly, select signals produced by the unit gate circuits in the gate circuit GCR are supplied to the corresponding unit column switch driver in the column switch driver CSDR. The individual unit column switch drivers are served with signals from the first Y-address decoder circuit Y-DEC$_1$. The unit column switch drivers served with the select signals, produce select signals which couple only a pair of complementary data lines designated by the output signals of the first Y-address decoder circuit Y-DEC$_1$ to a pair of complementary common data lines. Namely, among the four pairs of complementary data lines designated by select signals from the unit gate circuits, only a pair of complementary data lines designated by the complementary address signals $\overline{ay0}$, $\overline{ay1}$ are coupled to a pair of complementary common data lines.

The aforementioned various timing signals as well as various timing signals required for the operation, are formed by a timing signal generator TG. That is, the timing signal generator TG forms a variety of timing signals relying upon an address strobe signal $\overline{RAS}$ of the X system supplied via an external terminal $\overline{RAS}$, an address strobe signal $\overline{CAS}$ of the Y system supplied via an external terminal $\overline{CAS}$, and a write enable signal $\overline{WE}$ supplied via an external terminal $\overline{WE}$.

FIG. 2A is a block diagram illustrating in detail the memory array M-ARY$_1$ and the peripheral circuits.

Figure 2:
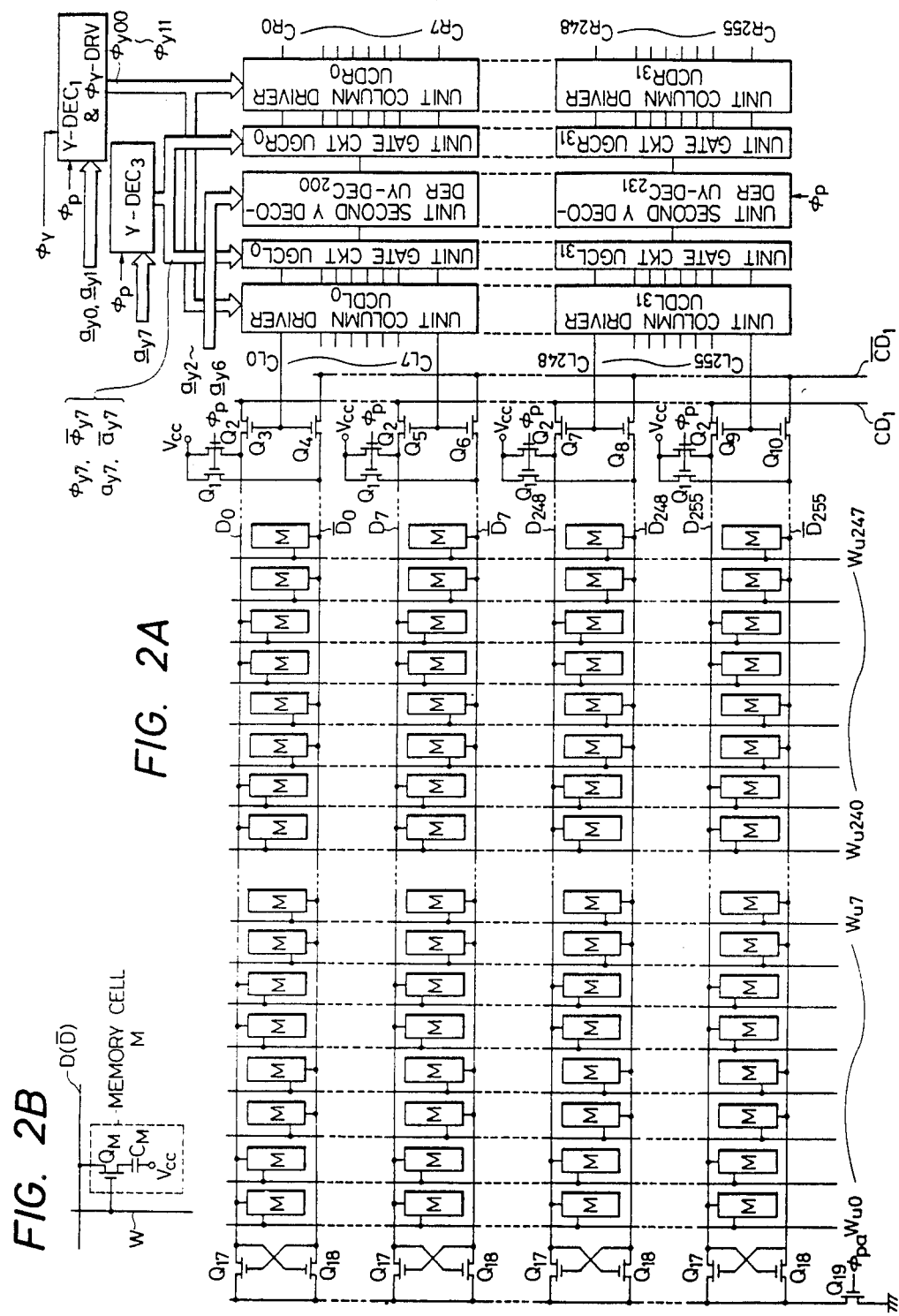
FIG. 2A is a block diagram showing a portion of the dynamic RAM of FIG. 1.
FIG. 2B is a circuit diagram showing a memory cell.

As described with reference to FIG. 1, each of the second Y-address decoder circuit Y-DEC$_2$, gate circuits GCL, GCR, and column switch drivers CSDL, CSDR corresponding to the memory arrays M-ARY$_1$, M-ARY$_2$, is made up of 32 unit circuits. Among these unit circuits, FIG. 2 shows only two unit decoder circuits UY-DEC$_{200}$, UY-DEC$_{231}$, four unit gate circuits UGCL$_0$, UGCR$_0$, UGCL$_{31}$, UGCR$_{31}$ corresponding to the two unit decoder circuits UY-DEC$_{200}$, UY-DEC$_{231}$, and four unit column switch drivers UCDL$_0$, UCDR$_0$, UCDL$_{31}$, UCDR$_{31}$ corresponding to these unit gate circuits.

As mentioned earlier, the memory array M-ARY$_1$ has 65536 memory cells M that are arranged in the form of a matrix. Namely, the memory cells M are arranged in 256 (rows)×256 (columns). A pair of complementary data lines D, $\overline{D}$ are formed for each row, and a word line is formed for each column. Therefore, the memory array M-ARY$_1$ is provided with 256 pairs of complementary data lines D$_0$, $\overline{D}_0$, to D$_{255}$, $\overline{D}_{255}$ and with 256 word lines W$_{U0}$ to W$_{U255}$.

Among 256 pairs of complementary data lines mentioned above, FIG. 2A shows two pairs of complementary data lines D$_0$, $\overline{D}_0$, D$_7$, $\overline{D}_7$ that are to be selected by select signals produced by the unit column swtich driver UCDL$_0$, and two pairs of complementary data lines D$_{248}$, $\overline{D}_{248}$, D$_{255}$, $\overline{D}_{255}$ that are to be selected by select signals produced by the unit column switch driver UCDL$_{31}$.

Among 256 word lines, FIG. 2A shows only 16 word lines W$_{U0}$ to W$_{U7}$, and W$_{U240}$ to W$_{U247}$ that will be selected by select signals produced by unit word drivers UWDU$_0$, UWDU$_{30}$ which will be explained later with reference to FIG. 3.

FIG. 2B illustrates an embodiment of the memory cell M which consists of a select terminal coupled to a word line W, an input/output terminal that is to be connected to either one of the pair of complementary data lines D, $\overline{D}$, a MOSFET Q$_{25}$, and a capacitor C$_M$. The gate electrode of the MOSFET Q$_M$ is coupled to the select terminal, one input/output electrode of the MOSFET Q$_{25}$ is coupled to the input/output terminal, and the other input/output electrode of the MOSFET Q$_{25}$ is coupled to the capacitor C$_M$.

In the dynamic RAM of this embodiment, although there is no particular limitation, the memory array is constituted in a so-called folded bit line arrangement.

Namely, a pair of complementary data lines (e.g., D$_0$ and $\overline{D}_0$) are arranged in parrel with each other. As shown in FIG. 2A, the input/output terminals of a plurality of memory cells M are coupled to either one of the pair of complementary data lines D$_0$, $\overline{D}_0$ according to a predetermined rule. A pair of input/output terminals of a sense amplifier is coupled to the pair of complementary data lines D$_0$, $\overline{D}_0$. Although there is no particular limitation, the sense amplifier consists of a pair of input/output terminals and MOSFET's Q$_{17}$ to Q$_{19}$. That is, the gate of MOSFET Q$_{17}$ and the drain of MOSFET Q$_{18}$ are coupled to one input/output terminal of the pair of input/output terminals, and the drain of MOSFET $Q_{17}$ and the gate of MOSFET $Q_{18}$ are coupled to the other input/output terminal. The source of MOSFET $Q_{17}$ and the source of MOSFET $Q_{18}$ are commonly connected together, and are coupled to a point of ground potential of the circuit via a MOSFET $Q_{19}$ that is controlled by a timing signal $\phi_{pa}$.

Further, precharging MOSFET's $Q_1$, $Q_2$ of which the switching operation will be controlled by a timing signal $\phi_p$ (precharging signal) are provided between a power-source voltage $V_{CC}$ and the data lines $D_0$, $\overline{D}_0$. MOSFET's $Q_3$, $Q_4$ for column switches are provided between the pair of complementary data lines $D_0$, $\overline{D}_0$ and the pair of complementary common data lines $CD_1$, $\overline{CD}_1$. The gates of MOSFET's for column switches are served with a signal $C_{L0}$ from the unit column switch driver $UCDL_0$.

Like the above-mentioned pair of complementary data lines $D_0$, $\overline{D}_0$, the other pairs of complementary data lines $D_1$, $\overline{D}_1$ to $D_{255}$, $\overline{D}_{255}$ are also provided with memory cells, sense amplifier, precharging MOSFET's, and MOSFET's for column switches.

In the memory array, the select terminals of a plurality of memory cells constituting a memory cell column are coupled to the same word line (e.g., $W_{U0}$) Therefore, memory cells constituting a memory cell column are served with a select signal from a unit word driver via the word line $W_{U0}$. The other memory cell columns have also been constructed in the same manner as the above-mentioned memory cell column.

Though not shown in FIG. 2A, a dummy cell is coupled to each of the data lines. As is well known, the dummy cell applies a reference potential to the sense amplifier during the reading operation. Therefore, when a memory cell is selected with its input/output terminal being connected to one of the pair of complementary data lines, a dummy cell connected to the other data line is selected. Accordingly, the sense amplifier is served with a potential corresponding to data stored in the selected memory cell, and with the reference potential from the dummy cell.

In the dynamic RAM of this embodiment, the second X-address decoder circuit X-DEC$_2$ selects a unit gate circuit out of 32 unit gate circuits UGCU$_0$ to UGCU$_{31}$ which constitute the gate circuit GCU, and selects a unit gate circuit out of 32 unit gate circuits UGCD$_0$ to UGCD$_{31}$ which constitute the gate circuit GCD.

Figure 3:
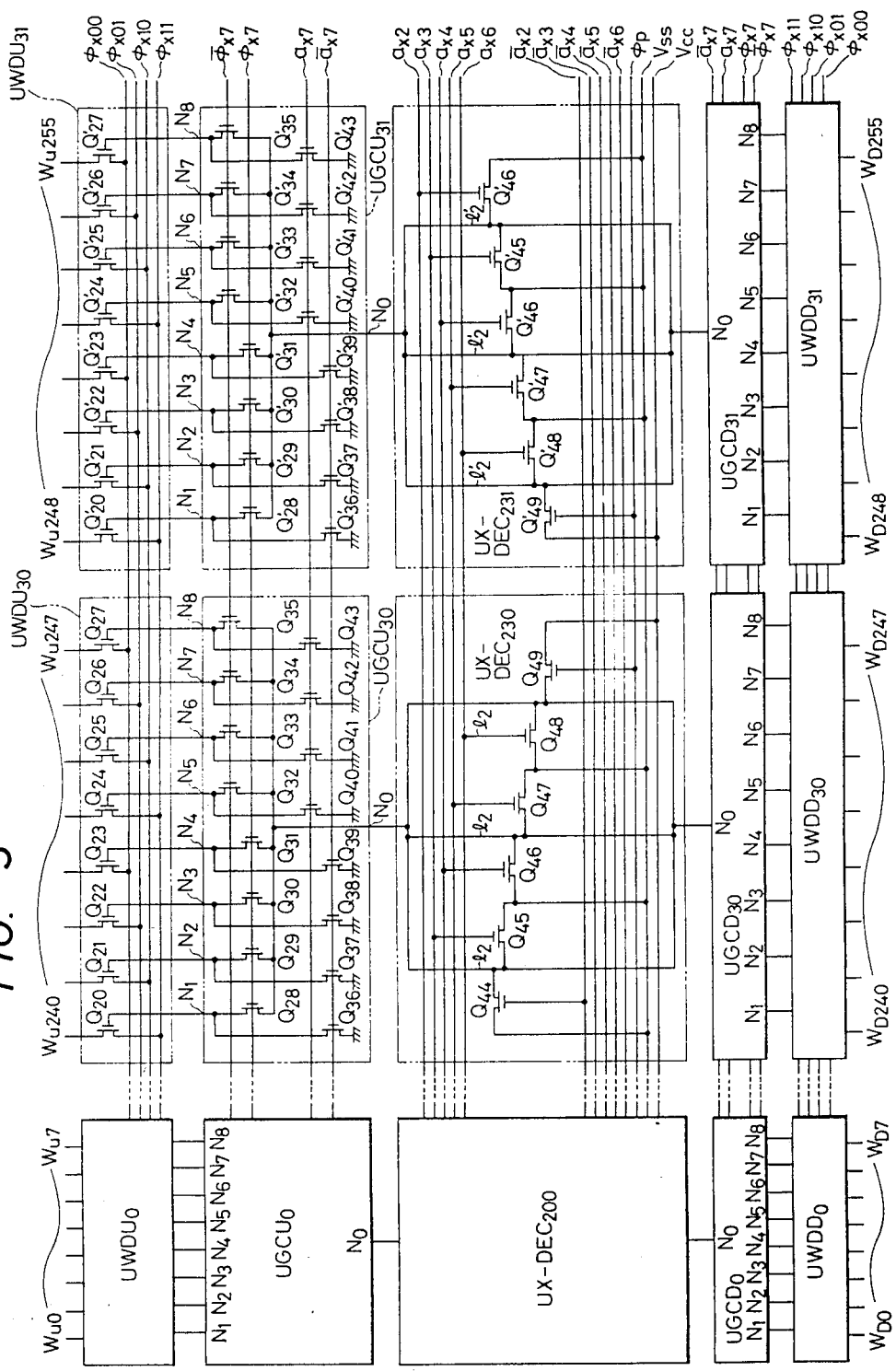
FIG. 3 is a circuit diagram showing an address decoder circuit X-DEC$_2$, gate circuits GCU, GCD, and word drivers WDU, WDD.

FIG. 3 illustrates the second X-address decoder circuit X-DEC$_2$, gate circuits GCU, GCD, and word drivers WDU, WDD according to an embodiment of the present invention.

Among 32 unit decoder circuits UX-DEC$_{200}$ to UX-DEC$_{231}$ constituting the second X-address decoder circuit X-DEC$_2$, FIG. 3 concretely illustrates only two unit decoder circuits UX-DEC$_{230}$ and UX-DEC$_{231}$. The unit decoder circuit UX-DEC$_{230}$ consists of a five-input NOR gate circuit made up of five drive MOSFET's $Q_{44}$ to $Q_{48}$ connected between the output lines $l_2$ and a point of ground potential $V_{SS}$ of the circuit, and a precharging MOSFET $Q_{49}$ which is provided between the output line $l_2$ and the point of power-source voltage $V_{CC}$ and of which the switching operation is controlled by a timing signal (precharging signal) $\phi_p$. Other unit decoder circuits have also been constructed in the same manner as the above-mentioned unit decoder circuit UX-DEC$_{230}$. However, attention should be given to that internal address signals of different combinations are supplied to the unit decoder circuits.

Therefore, only a unit decoder circuit which is designated by the complementary address signals $\overline{ax}2$ to $\overline{ax}6$ forms a select signal of the high level among 32 unit decoder circuits UX-DEC$_{200}$ to UX-DEC$_{231}$, and other unit decoder circuits form non-select signals of the low level. Accordingly, a select signal is supplied to only one unit gate circuit among 32 unit gate circuits UGCU$_0$ to UGCU$_{31}$ constituting the gate circuit GCU, and a select signal is also supplied to only one unit gate circuit among 32 unit gate circuits UGCD$_0$ to UGCD$_{31}$ constituting the gate circuit GCD.

For example, when the internal address signals $\overline{ax}2$, axp3, ax4, ax5 and ax6 have assumed the low level, only the unit decoder circuit UX-DEC$_{230}$ produces a select signal of the high level. Therefore, the select signal is supplied to two unit gate circuits UGCU$_{30}$ and UGCD$_{30}$ that are corresponded to the unit decoder circuit UX-DEC$_{230}$.

The unit gate circuit UGCU$_{30}$ consists of transfer gate MOSFET's $Q_{28}$ to $Q_{35}$ which selectively supply decoded signals produced by the corresponding unit decoder circuit UX-DEC$_{230}$ to the corresponding unit word driver UWDU$_{30}$, and resetting MOSFET's $Q_{36}$ to $Q_{43}$ provided between each of the output terminals $N_1$ to $N_8$ of the unit gate circuit UGCU$_{30}$ and the point of ground potential of the circuit. The above-mentioned eight transfer gate MOSFET's $Q_{28}$ to $Q_{35}$ can be divided into two groups, i.e., divided into four transfer gate MOSFET's $Q_{28}$ to $Q_{31}$ and four transfer gate MOSFET's $Q_{32}$ to $Q_{35}$. The above four transfer gate MOSFET's $Q_{28}$ to $Q_{31}$ and another group of four transfer gate MOSFET's $Q_{32}$ to $Q_{35}$ are controlled for their switching operation in a complementary manner by the output signals $\phi_{x7}$, $\overline{\phi}_{x7}$ from the third X-address decoder circuit X-DEC$_3$. The above-mentioned eight resetting MOSFET's can also be divided substantially into two groups. That is, the eight resetting MOSFET's can be divided into four resetting MOSFET's $Q_{40}$ to $Q_{43}$ of which the switching operation is controlled by the signal ax7 produced by the third X-address decoder circuit X-DEC$_3$ and four resetting MOSFET's $Q_{36}$ to $Q_{39}$ of which the switching operation is controlled by the signal $\overline{ax}7$. The resetting MOSFET's of these two groups are controlled for their switching operation in a complementary manner. The transfer gate MOSFET's $Q_{28}$ to $Q_{31}$ (or MOSFET's $Q_{32}$ to $Q_{35}$) and the resetting MOSFET's $Q_{36}$ to $Q_{39}$ (or $Q_{40}$ to $Q_{43}$) are controlled for their switching operation in a complementary manner.

For instance, when the transfer gate MOSFET's $Q_{28}$ to $Q_{31}$ (or $Q_{32}$ to $Q_{35}$) are turned on, the transfer gate MOSFET's $Q_{32}$ to $Q_{35}$ (or $Q_{28}$ to $Q_{31}$) are turned off. In this case, the resetting MOSFET's $Q_{36}$ to $Q_{39}$ (or $Q_{40}$ to $Q_{43}$) are turned off, and the resetting MOSFET's $Q_{40}$ to $Q_{43}$ (or $Q_{36}$ to $Q_{39}$) are turned on.

Other unit gate circuits have also been constructed in the same manner as the above-mentioned unit gate circuit UGCU$_{30}$.

When a select signal of the high level is produced from the unit decoder circuit UX-DEC$_{230}$, the unit gate circuits UGCU$_{30}$ and UGCD$_{30}$ transmit the select signals to four output terminals designated by output signals of the third X-address decoder circuit X-DEC$_3$ among the eight output terminals $N_1$ to $N_8$. In this case, the potential of four output terminals to which the select signal has not been transmitted is changed to the low level by the resetting MOSFET's.

Figure 5:
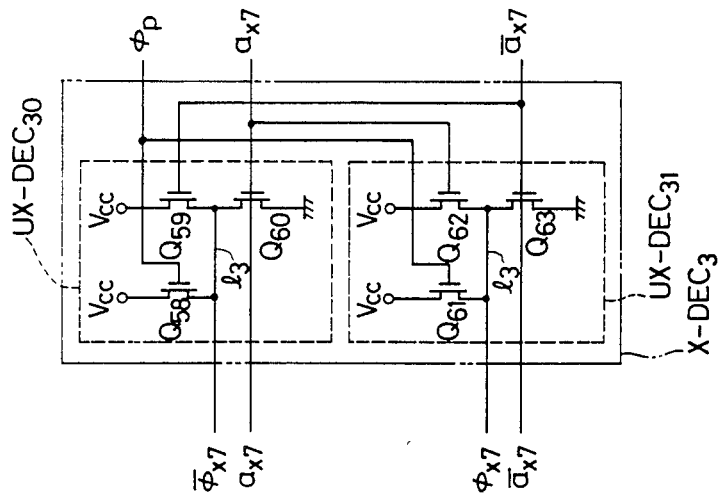
FIG. 5 is a circuit diagram showing an address decoder circuit X-DEC$_3$.

FIG. 5 shows an example of the third X-address decoder circuit X-DEC$_3$ which consists of two unit decoder circuits UX-DEC$_{30}$ and UX-DEC$_{31}$. The unit decoder circuit UX-DEC$_{30}$ consists of MOSFET's Q$_{59}$, Q$_{60}$ which substantially constitute a push-pull inverter, and a precharging MOSFET Q$_{58}$ which is provided between the output line l$_3$ and the point of power-source voltage V$_{CC}$ and of which the switching operation is controlled by the timing signal $\phi_p$. The other unit decoder circuit UX-DEC$_{31}$ is also constructed in the same manner as the above unit decoder circuit UX-DEC$_{30}$. As shown in FIG. 5, however, different internal address signals are supplied to the MOSFET's that constitute the push-pull inverter.

Therefore, when the internal address signal ax7 (or $\overline{ax7}$) assumes the high level, the unit decoder circuit UX-DEC$_{31}$ produces a select signal $\phi_{x7}$ of the high level (or UX-DEC$_{30}$ produces a select signal $\overline{\phi}_{x7}$ of the high level), and the unit decoder circuit UX-DEC$_{30}$ produces a non-select signal $\overline{\phi}_{x7}$ of the low level (or UX-DEC$_{31}$ produces a non-select signal $\phi_{x7}$ of the low level).

Therefore, the unit gate circuits which receive output signals from the third X-address decoder circuit X-DEC$_3$ have a function to select four word lines designated by the complementary address signal ax7 out of eight word lines. Namely, the unit gate circuits UG-CU$_{30}$ and UGCD$_{30}$ transmit select signals to four output terminals designated by the complementary address signal ax7 out of eight output terminals N$_1$ to N$_8$.

Output signals produced by the unit gate circuits are supplied to the corresponding unit word drivers. The unit word driver UWDU$_{30}$ corresponding to the unit gate circuit UGCU$_{30}$ consists of eight transfer gate MOSFET's Q$_{20}$ to Q$_{27}$ as shown in FIG. 3. The gate of the transfer gate MOSFET Q$_{20}$ is connected to the output terminal N$_1$ of the corresponding unit gate circuit UGCU$_{30}$ and to the output line l$_2$ of the corresponding unit decoder circuit UX-DEC$_{230}$ via a transfer gate MOSFET Q$_{28}$. Similarly, the gate of the transfer gate MOSFET Q$_{21}$ is connected to the output terminal N$_2$ and to the output line l$_2$ via MOSFET Q$_{29}$, the gate of the tranfer gate MOSFET Q$_{22}$ is connected to the output terminal N$_3$ and to the output line l$_2$ via MOSFET Q$_{30}$, . . . , and the gate of the transfer gate MOSFET Q$_{27}$ is connected to the output terminal N$_8$ and to the output line l$_2$ via MOSFET Q$_{35}$. Further, the select timing signal $\phi_{x00}$ of the first X-address decoder circuit & the select timing signal driver X-DEC & $\phi_x$-DRV is supplied to one electrode of each of the transfer gate MOSFET's Q$_{23}$, Q$_{27}$, the select timing signal $\phi_{x01}$ is supplied to one electrode of each of the transfer gate MOSFET's Q$_{22}$, Q$_{26}$, the select timing signal $\phi_{x10}$ is supplied to one electrode of each of the transfer gate MOSFET's Q$_{21}$, Q$_{25}$, and the select timing signal $\phi_{x11}$ is supplied to one electrode of each of the transfer gate MOSFET's Q$_{20}$, Q$_{24}$.

Further, the corresponding word lines W$_{U240}$ to W$_{U248}$ are connected to the other electrode of each of the transfer gate MOSFET's Q$_{20}$ to Q$_{27}$. The other unit word drivers have also been constructed in the same manner as the above unit word driver UWDU$_{30}$.

When a select signal is produced from the unit decoder circuit UX-DEC$_{230}$, and an internal address signal $\overline{ax7}$ of the low level is supplied to the third X-address decoder circuit X-DEC$_3$, select signals are produced from each of the output terminals N$_1$ to N$_4$ of the unit gate circuits UGCU$_{30}$, UGCD$_{30}$, and the potential of other output terminals N$_5$ to N$_8$ assume the low level. Therefore, among eight transfer gate MOSFET's constituting the unit word drivers UWDU$_{30}$, UWDD$_{30}$, the transfer gate MOSFET's Q$_{24}$ to Q$_{27}$ are turned off, and the transfer gate MOSFET's Q$_{20}$ to Q$_{23}$ are turned on. Accordingly, the word lines W$_{U243}$ and W$_{D243}$ are served with the select timing signal $\phi_{x00}$ via the transfer gate Q$_{23}$, the word lines W$_{U242}$ and W$_{D242}$ are served with the select timing signal $\phi_{x01}$ via the transfer gate MOSFET Q$_{22}$, the word lines W$_{U241}$ and W$_{D241}$ are served with the select timing signal $\phi_{x10}$ via the transfer gate MOSFET Q$_{21}$, and the word lines W$_{U240}$ and W$_{D240}$ are served with the select timing signal $\phi_{x11}$ via the transfer gate MOSFET Q$_{20}$.

As will be described later in detail with reference to FIG. 4, among the four select timing signals $\phi_{x00}$ to $\phi_{x11}$, only one select timing signal designated by the complementary address signals ax0, ax1 is changed to the high level by the first X-address decoder circuit & select timing signal driver X-DEC$_1$ & $\phi_x$-DRV. For instance, when the select timing signal $\phi_{x00}$ assumes the high level, a select timing signal of the high level is transmitted to the word lines W$_{U243}$, W$_{D243}$ only. In other words, the select timing signal of the high level is supplied to the word lines W$_{U243}$, W$_{D243}$ only that are designated by the complementary address signals ax0 to ax7 among a plurality of word lines constituting the memory arrays. Therefore, the word lines W$_{U243}$, W$_{D243}$ are selected.

As the select timing signal of the high level is supplied to the word line W$_{U243}$, memory cells are selected whose select terminals being coupled to this word line. The potential of data line coupled to the input/output terminals of the selected memory cells varies depending upon the data stored in the memory cells. In this case, a dummy cell is coupled to the other data line which constitutes a pair with respect to the above data line, and a reference potential is applied to the other data line. Thereafter, the sense amplifier coupled to the pair of data lines is operated, and a potential difference between the pair of data lines is amplified. As mentioned above, the complementary data lines D$_0$, $\overline{D}_0$ to D$_{256}$, $\overline{D}_{256}$ assume the potentials determined by the data stored in the memory cells which are selected and which are coupled to either one side of these complementary data lines. Among these complementary data lines D$_0$, $\overline{D}_0$ to D$_{256}$, $\overline{D}_{256}$, a pair of complementary data lines designated by the complementary address signals ay0 to ay7 is selected by the first Y-address decoder circuit & select timing signal driver Y-DEC$_1$ & $\phi_Y$-DRV, second and third Y-address decoder circuits Y-DEC$_2$, Y-DEC$_3$, column switch C-SW, column switch driver CSD, and gate circuit GC. Consequently, the input & output circuit receives the data stored in the memory cells designated by the complementary address signals ax0 to ax7, ay0 to ay7 from the four memory arrays M-ARY$_1$ to M-ARY$_4$ via complementary common data lines CD$_1$, $\overline{CD}_1$ to CD$_4$, $\overline{CD}_4$.

Upon receipt of complementary address signals ax0, ax1 and a select timing signal $\phi_x$ formed by the timing signal generator TG (refer to FIG. 1), the first X-address decoder circuit & select timing signal driver X-DEC$_1$ & $\phi_x$-DRV produces the above-mentioned four select timing signals $\phi_{x00}$ to $\phi_{x11}$. The thus formed select timing signals $\phi_{x00}$ to $\phi_{x11}$ are supplied to the unit word drivers UWDU$_0$ to UWDU$_{31}$ and UWDD$_0$ to UWDD$_{31}$. FIG. 4 illustrates an embodiment of the first X-address decoder circuit & select timing signal driver X-DEC$_1$ & $\phi_x$-DRV.

The first X-address decoder circuit & select timing signal driver X-DEC$_1$ & $\phi_x$-DRV consists of the first X-address decoder circuit X-DEC$_1$ which decodes the complementary address signals ax0, ax1, and the select timing signal driver $\phi_x$-DRV which receives output signals of the first X-address decoder circuit X-DEC$_1$ and the select timing signal $\phi_x$ and which produces the select timing signals $\phi_{x00}$ to $\phi_{x11}$.

The first X-address decoder circuit X-DEC$_1$ consists of four unit decoder circuits UX-DEC$_{10}$ to UX-DEC$_{13}$. FIG. 4 illustrates in detail the unit decoder circuit UX-DEC$_{10}$ only among the four unit decoder circuits. The unit decoder circuit UX-DEC$_{10}$ consists of two-input NOR gate circuit which is made up of two drive MOSFET's Q$_{52}$, Q$_{53}$ coupled between the output line l$_1$ and ground potential V$_{SS}$ of the circuit, and a precharging MOSFET Q$_{50}$ which is coupled between the output line l$_1$ and the power-source voltage V$_{CC}$ and of which the switching operation is controlled by a timing signal (precharge signal) $\phi_p$, and a so-called cut MOSFET Q$_{51}$ of which the one electrode is connected to the output line l$_1$ and of which the gate electrode is coupled to the power-source voltage V$_{CC}$. The other unit decoder circuits UX-DEC$_{11}$ to UX-DEC$_{13}$ have also been constructed in the same manner as the above-mentioned unit decoder circuit UX-DEC$_{10}$. Here, attention should be given to the fact that internal address signals of different combinations are supplied to each of the unit decoder circuits. Accordingly, among the four unit decoder circuits, only a unit decoder circuit designated by the complementary address signals ax0, ax1 produce a select signal of the high level, and the other unit decoder circuits produce non-select signals of the low level.

The select timing signal driver $\phi_x$-DRV consists of four transfer gate MOSFET's Q$_{54}$ to Q$_{57}$. The select timing signal $\phi_x$ is supplied to one electrode of each of the transfer gate MOSFET's Q$_{54}$ to Q$_{57}$. The select timing signals $\phi_{x00}$ to $\phi_{x11}$ are produced from the other electrode of each of the transfer gate MOSFET's Q$_{54}$ to Q$_{57}$. Further, the transfer gate MOSFET's are controlled for their switching operation by the corresponding unit decoder circuits. Namely, the transfer gate MOSFET Q$_{54}$ is controlled for its switching operation by a signal produced by the unit decoder circuit UX-DEC$_{10}$, the transfer gate MOSFET Q$_{55}$ is controlled for its switching operation by a signal produced by the unit decoder circuit UX-DEC$_{11}$, the transfer gate MOSFET Q$_{56}$ is controlled for its switching operation by a signal produced by the unit decoder circuit UX-DEC$_{12}$, and the transfer gate MOSFET Q$_{57}$ is controlled for its switching operation by a signal produced by the unit decoder circuit UX-DEC$_{13}$. Therefore, among the four transfer gate MOSFET's, only a transfer gate MOSFET designated by the complementary address signals ax0, ax1 is turned on. Therefore, a select timing signal $\phi_x$ is produced as a select timing signal among the select timing signals $\phi_{x00}$ to $\phi_{x11}$. The select timing signal $\phi_x$ assumes the high level while the select operation is being carried out for the word lines. Therefore, while the select operation of word lines is being carried out, any one signal assumes the high level among the select timing signals $\phi_{x00}$ to $\phi_{x11}$.

For instance, if the internal address signals ax0, ax1 assume the low level, the unit decoder circuit UX-DEC$_{10}$ produces a select signal which causes the MOSFET Q$_{54}$ only to be turned on. Therefore, the select timing signal $\phi_x$ is produced as a select timing signal $\phi_{x00}$ via the MOSFET Q$_{54}$. Namely, while the selection operation of word lines is being carried out, the MOSFET Q$_{54}$ produces the select signal $\phi_{x00}$ of the high level.

As mentioned above, the unit decoder circuit is provided with the cut MOSFET Q$_{51}$. Therefore, owing to the self-bootstrap function of the transfer gate MOSFET, the high-level value of the select timing signal $\phi_{x00}$ can be brought substantially equal to the high-level value of the select timing signal $\phi_x$. Namely, when the high level is applied to the gate electrode of the transfer gate MOSFET Q$_{54}$ via the cut MOSFET Q$_{51}$, an inverted layer is formed under the gate electrode of the transfer gate MOSFET Q$_{54}$. Therefore, a capacitor is formed between the gate electrode and the inverted layer, and is electrically charged. If the select timing signal $\phi_x$ is charged from the low level to the high level to select a word line, the potential of gate electrode of the transfer gate MOSFET Q$_{54}$ is raised owing to the function of the capacitor which is electrically charged. Accordingly, the potential of select timing signal $\phi_{x00}$ becomes nearly equal to the potential of select timing signal $\phi_x$. In other words, the level loss caused by the threshold voltage of the transfer gate MOSFET can be reduced. Since the potential of gate electrode of the transfer gate MOSFET Q$_{54}$ rises, the cut MOSFET Q$_{51}$ is turned off. This makes it possible to prevent the discharge of electric charge from the capacitor.

Described below is the operation for selecting word lines in the dynamic RAM according to the embodiment, in conjunction with FIGS. 3 to 5.

When the address strobe signal $\overline{RAS}$ assumes the high level, the timing signal generator TG produces a timing signal $\phi_p$ of the high level. Due to this timing signal $\phi_p$, a parasitic capacity is precharged.

As the precharge signal $\phi_p$ assumes the high level, the precharging MOSFET Q$_{50}$ is turned on during the precharging period. Therefore, signals of the high level are produced from the unit decoder circuits UX-DEC$_{10}$ to UX-DEC$_{13}$ which constitute the first X-address decoder circuit X-DEC$_1$. Namely, all of the transfer gate MOSFET's Q$_{54}$ to Q$_{57}$ constituting the select timing signal driver $\phi_x$-DRV are turned on. Further, since the precharging MOSFET's Q$_{49}$, Q$_{49}'$ are turned on by a precharge signal $\phi_p$ of the high level, signals of the high level are produced from the unit decoder circuits UX-DEC$_{200}$ to UX-DEC$_{231}$ that constitute the second X-address decoder circuit X-DEC$_2$. Therefore, the unit gate circuits are served with signals of the high level from the corresponding unit decoder circuits UX-DEC$_{2n}$ (n=00 to 31). In this case, since the precharging MOSFET's Q$_{58}$, Q$_{61}$ have been turned on by the precharging signal $\phi_p$ of the high level, signals $\phi_{x7}$, $\overline{\phi_{x7}}$ of the high level are produced from the unit decoder circuits UX-DEC$_{30}$, UX-DEC$_{31}$ which constitute the third X-address decoder circuit X-DEC$_3$. Here, since the transfer gate MOSFET's Q$_{28}$ to Q$_{35}$ (Q$_{28}'$ to Q$_{35}'$) constituting the unit gate circuits are turned on, signals of the high level formed by the unit decoder circuits UX-DEC$_{2n}$ are transmitted to the gate electrodes of the transfer gate MOSFET's Q$_{20}$ to Q$_{27}$ (Q$_{20}'$ to Q$_{27}'$) that constitute unit word drivers. Therefore, the transfer gate MOSFET's Q$_{20}$ to Q$_{27}$ (Q$_{20}'$ to Q$_{27}'$) are turned on. At this moment, the timing signal generator TG is forming a select timing signal $\phi_x$ of the low level. Hence, select timing signals of the low level are supplied to the word lines.

Next, as the address strobe signal $\overline{RAS}$ is changed from the high level to the low level, the timing signal generator TG produces a precharge signal $\phi_p$ of the low level and a timing signal $\phi_{ax}$ of the high level. Responsive to the timing signal $\phi_{ax}$, the X-address buffer X-ADB introduces external address signals A0 to A8, and produces complementary address signals ax0 to ax8 that correspond to the introduced external address signals A0 to A8.

Described below is the case where the X-address buffer X-ADB has formed internal address signals $\overline{ax0}$, $\overline{ax1}$, ax2, $\overline{ax3}$ to $\overline{ax8}$ of the high level (in this case, the internal address signals ax0, ax1, $\overline{ax2}$, ax3 to ax8 are assuming the low level).

Since the internal address signals ax0, ax1 are assuming the low level, only the unit decoder circuit UX-DEC$_{10}$ continues to produce a select signal of the high level among the four unit decoder circuits UX-DEC$_{10}$ to UX-DEC$_{13}$. On the other hand, the other unit decoder circuits UX-DEC$_{11}$ to UX-DEC$_{13}$ produce non-select signal of the low level since the internal address signals $\overline{ax0}$, $\overline{ax1}$ are assuming the high level. Therefore, only the transfer gate MOSFET Q$_{54}$ is turned on among the four transfer gate MOSFET's Q$_{54}$ to Q$_{57}$, and the other three MOSFET's Q$_{55}$ to Q$_{57}$ are turned off.

Since the internal address signals $\overline{ax2}$, ax3, to ax6 are assuming the low level, only the unit decoder circuit UX-DEC$_{230}$ served with a combination of internal address signals $\overline{ax2}$, ax3, to ax6 continues to produce a select signal of the high level among the 32 unit decoder circuits UX-DEC$_{200}$ to UX-DEC$_{231}$ constituting the second X-address decoder circuit X-DEC$_2$, and the other unit decoder circuits form non-select signals of the low level. Therefore, a signal (select signal) of the high level is kept supplied to the unit gate circuits UG-CU$_{30}$ and UGCD$_{30}$ from the unit decoder circuit UX-DEC$_{230}$. On the other hand, signals (non-select signals) of the low level are kept supplied to the other unit gate circuits from the corresponding unit decoder circuits UX-DEC$_{2n}$ (n=00 to 29, 31).

Since the internal address signal $\overline{ax7}$ assumes the high level, the unit decoder circuit UX-DEC$_{30}$ continues to produce a signal (select signal) $\overline{\phi}_{x7}$ of the high level between two unit decoder circuits constituting the third X-address decoder circuit X-DEC$_3$. On the other hand, the unit decoder circuit UX-DEC$_{31}$ produces a signal (non-select signal) $\phi_{x7}$ of the low level.

Therefore, the transfer gate MOSFET's Q$_{32}$ to Q$_{35}$ are maintained conductive among the eight transfer gate MOSFET's constituting the unit gate circuits UG-CU$_{30}$, UGCD$_{30}$, and other transfer gate MOSFET's Q$_{28}$ to Q$_{31}$ are rendered nonconductive. Further, among the eight resetting MOSFET's constituting the unit gate circuits UGCU$_{30}$, UGCD$_{30}$, the resetting MOSFET's Q$_{36}$ to Q$_{39}$ receiving the internal address signal $\overline{ax7}$ of the high level are turned on, and the resetting MOSFET's Q$_{40}$ to Q$_{43}$ receiving the internal address signal ax7 are turned off. As the resetting MOSFET's Q$_{40}$ to Q$_{43}$ are turned on, potentials of the output terminals N$_1$ to N$_4$ assume ground potential. Therefore, the transfer gate MOSFET's Q$_{20}$ to Q$_{23}$ are turned off among the eight transfer gate MOSFET's constituting the unit word drivers UWDU$_{30}$, UWDD$_{30}$.

Then, a select timing signal $\phi_x$ which rises to the high level is produced from the timing signal generator TG; i.e., the select timing signal $\phi_x$ is produced as a select timing signal $\phi_{x00}$ from the select timing signal driver $\phi_x$-DRV via the transfer gate MOSFET Q$_{54}$ which has been turned on. Namely, the first X-address decoder circuit X-DEC$_1$ renders the select timing signal $\phi_{x00}$ only to assume the high level among the four select timing signals $\phi_{x00}$ to $\phi_{x11}$. Therefore, the word lines WU$_{247}$, WD$_{247}$ only are selected, and their potentials assume the high level responsive to a selected timing signal $\phi_x$. Although there is no particular limitation, when the level of the select timing signal $\phi_x$ is raised by the bootstrap circuit, level loss caused by the threshold voltage of MOSFET is reduced by the self bootstrap function of the transfer gate MOSFET's Q$_{54}$, Q$_{27}$, and the level of the select timing signal $\phi_x$ is transmitted to the word lines WU$_{247}$, WD$_{247}$. Here, the MOSFET Q$_{35}$ works as a cut MOSFET which, when the gate voltage of the MOSFET Q$_{27}$ is raised by the self bootstrap function, prevents the gate voltage from being delivered to the side of the unit decoder circuit UX-DEC$_{230}$.

Although the transfer gate MOSFET's Q$_{24}$ to Q$_{26}$ have been turned on, the word lines WU$_{244}$ to WU$_{246}$, and WD$_{244}$ to WD$_{246}$ are served with non-select signals of the low level and are not selected since the select timing signals $\phi_{x01}$ to $\phi_{x11}$ are of the low level.

FIG. 7 illustrates an embodiment of the address buffer ciructi X-ADB, i.e., shows a circuit diagram of a portion which forms the complementary address signal ax2 upon receipt of the external address signal A$_2$.

In FIG. 7, an ampligier 1 receives the address signal A$_2$ and a reference voltage Vref produced by a reference voltage generator circuit that is not shown, and produces an address signal a2 in phase with the external address signal A$_2$ and an address signal $\overline{a2}$ of which the phase is inverted relative to the external address signal A$_2$. The formed address signals a2, $\overline{a2}$ are supplied to an output circuit that will be mentioned below.

The output circuit consists of MOSFET's Q$_{84}$, Q$_{85}$, drive MOSFET's Q$_{86}$, Q$_{87}$ of which the operation is controlled by address signals a2, $\overline{a2}$ supplied via the MOSFET's Q$_{84}$, Q$_{85}$, and a pair of MOSFET's Q$_{88}$, Q$_{89}$ of which the drains and gates are connected together in a crossing manner.

When the external address signal A$_2$ assumes the high level, the amplifier 1 produces an address signal a2 of the high level and an address signal $\overline{a2}$ of the low level. Therefore, the MOSFET Q$_{86}$ is turned on, and the MOSFET Q$_{87}$ is turned off. A timing signal $\phi_{ax}$ of the high level which is produced by the timing signal generator circuit TG to introduce the address signal, is transmitted to the gate of the MOSFET Q$_{89}$. Accordingly, the MOSFET Q$_{89}$ is turned on, and the MOSFET Q$_{88}$ is turned off. Hence, an internal address signal ax2 of the high level and an internal address signal $\overline{ax2}$ of the low level are produced from the output circuit. Here, the MOSFET's Q$_{84}$, Q$_{85}$ are cut MOSFET's that are provided such that the MOSFET Q$_{86}$ or Q$_{87}$ will produce the self bootstrap function.

Other complementary address signals are formed by circuits that are constructed in the same manner as the above-mentioned circuit.

According to this embodiment, the consumption of electric power can be reduced since the number of unit decoder circuits is small.

Further, since the number of MOSFET's served with the internal address signals is samll, the load for the output circuit can be reduced. Accordingly, the output circuit is allowed to form complementary address signals having predetermined potentials within short periods of time. Accordingly, the dynamic RAM features a high-speed operation.

Figure 9:
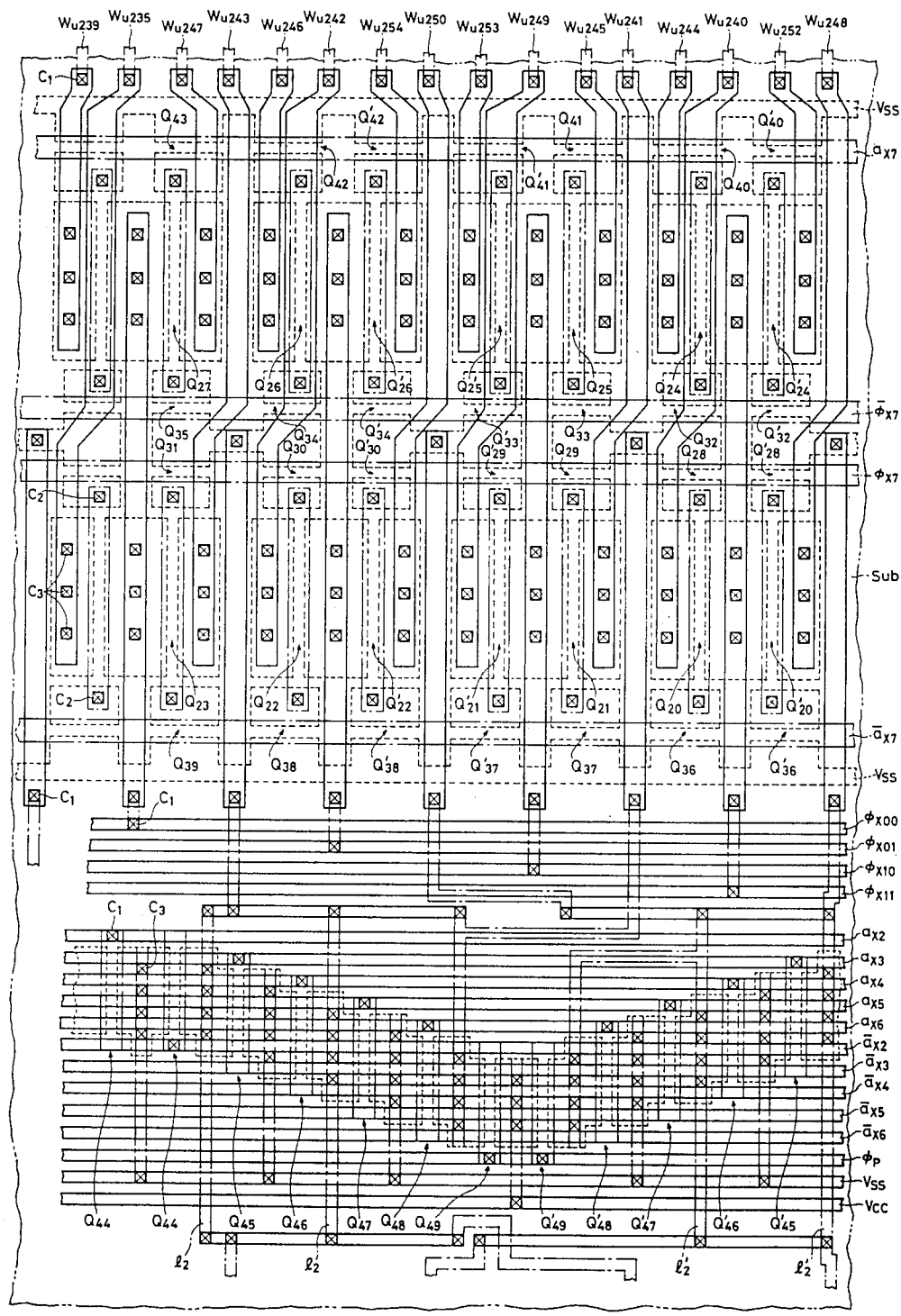
FIG. 9 is a plan view showing a layout of the dynamic RAM to which the present invention is adapted.

FIG. 9 is a plan view of the second X-address decoder circuit X-DEC$_2$, gate circuit GCU and word driver WDU, which correspond to the unit decoder circuits DEC$_{230}$, DEC$_{231}$, unit gate circuits UGCU$_{30}$, UGCU$_{31}$, and unit word drivers UWDU$_{30}$, UWDU$_{31}$ that are shown in FIG. 3. In FIG. 9, the portions corresponding to the circuit elements of FIG. 3 are denoted by the same symbols.

In FIG. 9, a region Sub surrounded by a two-dot dash line represents a p-type semiconductor substrate, and regions surrounded by broken lines represent n-type semiconductor regions formed on the p-type semiconductor substrate Sub. The n-type semiconductor regions form a source region, a drain region and a wiring layer for the MOSFET. Regions surrounded by a dot-dash line represent electrically conductive polycrystalline silicon layers formed on the semiconductor substrate Sub via a field insulating film or a gate insulating film. The gate electrode or wiring layer of MOSFET is formed by the electrically conductive polycrystalline silicyn layer. In FIG. 9, regions surrounded by solid lines denote aluminum layers that form wiring layers. An intermediate insulating film is formed between the aluminum layer and the electrically conductive polycrystalline silicon layer. Contact holes C$_1$ are formed to electrically couple the aluminum layer and the electrically conductive polycrystalline silicon layer together. Namely, the contact holes C$_1$ are formed in the intermediate insulating film that is formed between the aluminum layer and the electrically conductive polycrystalline silicon layer, so that the aluminum layer and the electrically conductive polycrystalline silicon layer are coupled together via the contact holes.

In order to electrically couple the aluminum layer and the semiconductor region together, contact holes C$_3$ are formed in the insulating film that is formed therebetween, so that the aluminum layer and the semiconductor region are coupled together via the contact holes C$_3$. Similarly, when the electrically conductive polycrystalline silicon layer and the semiconductor region are to be electrically coupled together, contact holes C$_2$ are formed in an insulating film that is formed therebetween, so that the electrically conductive polycrystalline silicon layer and the semiconductor region are coupled together via the contact holes. Although a plurality of contact holes are formed, FIG. 9 shows only representative contact holes as designated at C$_1$, C$_2$ and C$_3$ to simplify the drawing.

Although there is no particular limitation, a semiconductor region V$_{SS}$ for supplying ground potential V$_{SS}$ of the circuit to the resetting MOSFET's Q$_{36}$ to Q$_{38}$ is coupled to an aluminum layer V$_{SS}$ which supplies ground potential V$_{SS}$ of the circuit via an electrically conductive polycrystalline silicon layer that is not diagrammed. Further, although there is no particular limitation, a semiconductor region V$_{SS}$ which supplies ground potential V$_{SS}$ of the circuit to the resetting MOSFET's Q$_{40}$ to Q$_{43}$ is coupled to a semiconductor region V$_{SS}$ which supplies ground potential V$_{SS}$ of the circuit to the resetting MOSFET's Q$_{36}$ to Q$_{38}$ via an aluminum layer that has not been diagrammed.

Further, a memory cell shown in FIG. 2B is formed between the word line (e.g., WU$_{246}$) and the neighboring word line (e.g., WU$_{243}$), and the select terminal of the thus formed memory cell is coupled to the word line WU$_{246}$ or WU$_{243}$.

As will be obvious from the comparison of FIG. 9 with FIG. 3, the order of word lines is different. In FIG. 3, the word lines are numbered from the left toward the right to simplify the drawing. When the gate circuits, word drivers and the like are practically formed, the word lines of FIG. 3 will be formed as shown in FIG. 9. Namely, by forming the unit gate circuits and unit word drivers as shown in FIG. 9, a select timing signal needs be taken out from one place for the two unit decoder circuits, and the occupied area can be reduced.

Gate electrode of a drive MOSFET (e.g., MOSFET Q$_{45}$) constituting a unit decoder circuit is coupled to an aluminum layer ax3 which transmits an internal address signal ax3 or to an aluminum layer $\overline{ax3}$ which transmits an internal address signal $\overline{ax3}$, depending upon an internal address signal that is supplied thereto.

Figure 4:
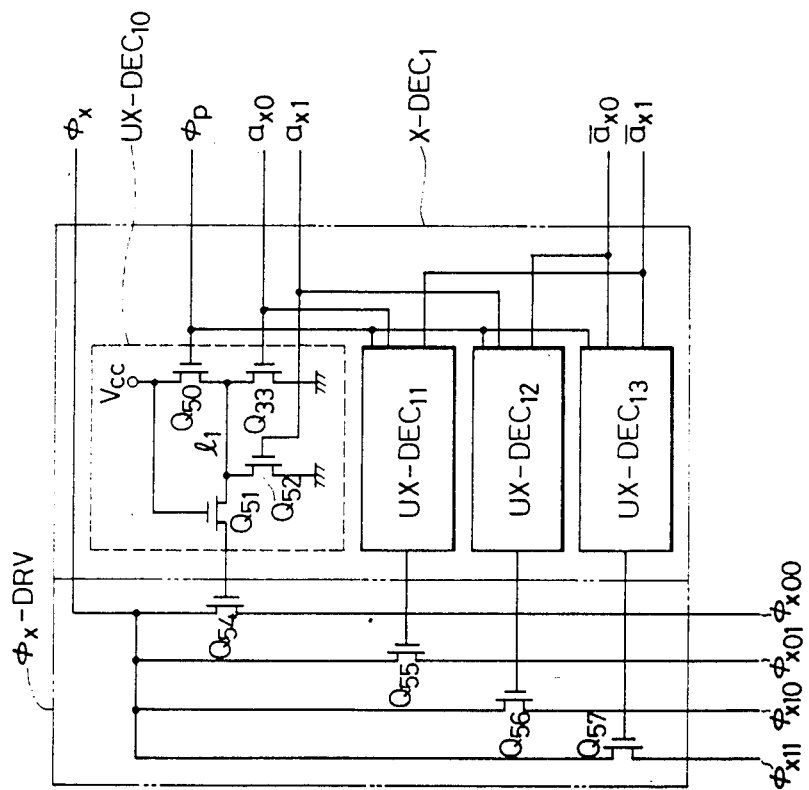
FIG. 4 is a circuit diagram showing an address decoder circuit X-DEC$_1$, and a $\phi_x$ driver $\phi_x$-DRV.

In this embodiment, the first Y-address decoder circuit & select timing signal driver Y-DEC$_1$ & $\phi_Y$-DRV (refer to FIG. 2A) is constructed in the same manner as the first X-address decoder circuit & select timing signal driver X-DEC$_1$ & $\phi_X$-DRV that is shown in FIG. 4. In this case, complementary address signals ay0, ay1 are supplied instead of the complementary address signals ax0, ax1, and a select timing signal $\phi_Y$ is supplied instead of the select timing signal $\phi_X$. Therefore, the first Y-address decoder circuit & select timing signal driver Y-DEC$_1$ & $\phi_Y$-DRV produces select timing signals $\phi_{y00}$ to $\phi_{y11}$ instead of the select timing signals $\phi_{x00}$ to $\phi_{x11}$.

Further, the third Y-address decoder circuit Y-DEC$_3$ (refer to FIG. 2A) is constructed in the same manner as the third X-address decoder circuit X-DEC$_3$ that is shown in FIG. 5. In this case, the third Y-address decoder circuit Y-DEC$_3$ is served with a complementary address signal ay7 instead of the complementary address signal ax7. Therefore, the third Y-address decoder circuit Y-DEC$_3$ produces signals $\phi_{y7}$, $\overline{\phi_{y7}}$ instead of the signals $\phi_{x7}$, $\overline{\phi_{x7}}$, and further produces signals ay7, $\overline{ay7}$ instead of the signals ax7, $\overline{ax7}$.

Each of 32 unit decoder circuits UY-DEC$_{200}$ to UY-DEC$_{231}$ (refer to FIG. 2A) constituting the second Y-address decoder circuit Y-DEC$_2$ is constructed in the same manner as the unit decoder circuit UX-DEC$_{230}$ shown in FIG. 3. In this case, the unit decoder circuits UY-DEC$_{200}$ to UY-DEC$_{231}$ are served with complementary address signals ay2 to ay6 instead of complementary address signals ax2 to ax6.

Each of 32 unit gate circuits UGCL$_0$ to UGCL$_{31}$ (UGCR$_0$ to UGCR$_{31}$) constituting the gate circuit GCL (GCR) is constructed in the same manner as the unit gate circuit UGCU$_{30}$ shown in FIG. 3. However, the unit gate circuits UGCL$_0$ to UGCL$_{31}$ are served with signals $\phi_{y7}$, $\overline{\phi_{y7}}$, ay7, $\overline{ay7}$ formed by the third Y-address decoder circuit Y-DEC$_3$ instead of the signals $\phi_{x7}$, $\overline{\phi_{x7}}$, ax7, $\overline{ax7}$.

Moreover, each of 32 unit column switch drivers UCDL$_0$ to UCDL$_{31}$ (UCDR$_0$ to UCDR$_{31}$) (refer to FIG. 2A) constituting the column switch driver CSDL (CSDR) is constructed in the same manner as the unit word driver UWDU$_{30}$ shown in FIG. 3. In this case, however, the unit column switch drivers UCDL$_0$ to UCDL$_{31}$ (UCDR$_0$ to UCDR$_{31}$) are served with select timing signals $\phi_{y00}$ to $\phi_{y11}$ formed by the first Y-address decoder circuit & select timing signal driver Y-DEC$_1$ & $\phi_Y$-DRV instead of the select timing signals $\phi_{x00}$ to $\phi_{x11}$.

The first, second and third Y-address decoder circuits Y-DEC$_1$, Y-DEC$_2$ and Y-DEC$_3$ operate in the same manner as the aforementioned first, second and third X-address decoder circuits X-DEC$_1$, X-DEC$_2$ and X-

DEC₃, and are not mentioned here. Further, the select timing signal driver φ_Y-DRV, gate circuit GCL (GCR) and column switch driver CSDL (CSDR) operate in the same manner as the aforementioned select timing signal driver φ_X-DRV, gate circuit GCU (GCD) and word driver WDU (WDD), and are not mentioned here.

Figure 6:
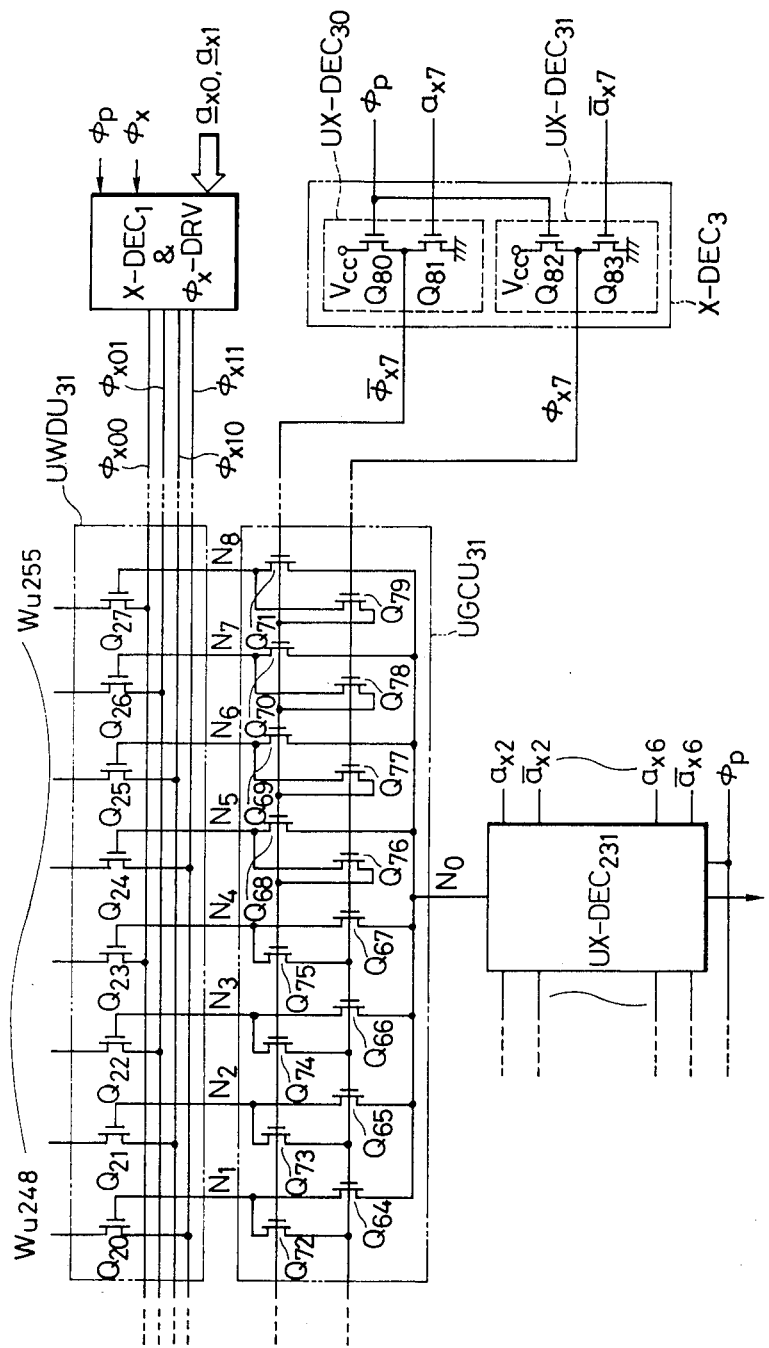
FIG. 6 is a circuit diagram showing another embodiment of a dynamic RAM to which the present invention is adapted.

FIG. 6 shows another embodiment of a dynamic RAM to which the present invention is adapted.

In FIG. 6, portions which operate in the same manner as those of FIGS. 3 to 5 are denoted by the same symbols. In this embodiment, the third X-address decoder circuit X-DEC₃ and the gate circuit GCU (GCD) are different from the third X-address decoder circuit X-DEC₃ and the gate circuit GCU (GCD) that are shown in FIGS. 5 and 3.

Namely, the third X-address decoder circuit X-DEC₃ consists of two unit decoder circuits UX-DEC₃₀ and UX-DEC₃₁. The unit decoder circuit UX-DEC₃₀ (UX-DEC₃₁) consists of a ratioless inverter circuit which is made up of MOSFET's Q₈₀, Q₈₁ (Q₈₂, Q₈₃). The MOSFET Q₈₀ (Q₈₂) is served with a precharge signal φ_p, and the drive MOSFET Q₈₁ (Q₈₂) is served with the internal address signal ax7 (ax7). Signals φ_x7, $\bar{\phi}_{x7}$ produced by the ratioless inverter circuit are supplied to the gate circuits GCU, GCD.

Each of the gate circuits GCU, GCD consists of 32 unit gate circuits UGCU₀ to UGCU₃₁ (UGCD₀ to UGCD₃₁) like those of the aforementioned embodiment. Among these unit gate circuits, a unit gate circuit UGCU₃₁ only is shown in FIG. 6. Other unit gate circuits have also been constructed in the same manner as the unit gate circuit UGCU₃₁.

The unit gate circuit UGCU₃₁ consists of transfer gate MOSFET's Q₆₄ to Q₆₇ controlled by the signal φ_x7, transfer gate MOSFET's Q₆₈ to Q₇₁ controlled by the signal $\bar{\phi}_{x7}$, resetting MOSFET's Q₇₆ to Q₇₉ controlled by the signal φ_x7, and resetting MOSFET's Q₇₂ to Q₇₅ controlled by the signal $\bar{\phi}_{x7}$.

The level of signal φ_x7 and the level of signal $\bar{\phi}_{x7}$ have complementary values according to complementary address signals ax7. For instance, when the internal address signal ax7 (or ax7) has the high level, the signal φ_x7 (or $\bar{\phi}_{x7}$) has the high level, and the signal $\bar{\phi}_{x7}$ (or φ_x7) has the low level. Accordingly, the transfer gate MOSFET's Q₆₄ to Q₆₇ (or Q₆₈ to Q₇₁) are turned on, and the transfer gate MOSFET's Q₆₈ to Q₇₁ (or Q₆₄ to Q₆₇) are turned off. Accordingly, signal (decoded signal) produced by the unit decoder cirucit UX-DEC₂₃₁ is supplied to the unit word driver UWDU₃₁ via transfer gate MOSFET's Q₆₄ to Q₆₇ (or Q₆₈ to Q₇₁) that have been turned on, and via output terminals N₁ to N₄ (or N₅ to N₈). In this case, potentials of the output terminals N₅ to N₈ (or N₁ to N₄) to which the transfer gate MOSFET's Q₆₈ to Q₇₁ (or Q₆₄ to Q₆₇) of the off condition have been coupled, are set to ground potential of the circuit via resetting MOSFET's Q₇₆ to Q₇₉ (or Q₇₂ to Q₇₅) that are turned on, and via the drive MOSFET Q₈₁ (or Q₈₃).

Therefore, when the signal produced by the unit decoder circuit UX-DEC₂₃₁ is a select signal, this select signal is supplied to a word line that is designated by complementary address signals ax0 to ax7 like the aforementioned embodiment.

According to this embodiment, no wiring is required to transmit the signals ax7, ax7 to the unit gate circuits. Therefore, the size of the dynamic RAM can be reduced by an area that would have been occupied at least by the wiring.

Below are mentioned some principal effects obtained by the present invention.

(1) The address decoder circuit is divided into three stages to decrease the number of unit address decoder circuits which constitute the address decoder circuit. For instance, 256 word lines (the same also holds true for the data lines) can be selected requiring a total of 38 unit address decoder circuits, i.e., requiring four first address decoder circuits, 32 second address decoder circuits, and two third address decoder circuits. This is one-half the number of address decoder circuits shown in FIG. 8.

(2) Cut MOSFET's are further utilized as transfer gate MOSFET's that select addresses. Therefore, the number of unit address decoders can be greatly reduced as described in (1) above, without substantially increasing the number of MOSFET's.

(3) With the number of unit address decoder circuits being reduced, the chip size of the semiconductor memory device can be reduced.

(4) Since the number of unit address decoder circuits is halved, the consumption of electric current can be reduced, and the consumption of electric power of the semiconductor memory device can be reduced, too.

(5) Load of the address buffer circuit decreases with the decrease in the number of unit address decoder circuits. Therefore, the address buffer circuit is allowed to form complementary address signals having predetermined levels within short periods of time and, hence, the semiconductor memory device operates at high speeds.

The present invention is in no way limited to the above-mentioned embodiments only, but can be modified in a variety of ways without departing from the gist thereof. For instance, when the third address decoder circuit X-DEC₃ is made up of a decoder circuit which decodes complementary address signals of two bits like the first address decoder circuit X-DEC₁, the number of unit decoder circuits constituting the second address decoder circuit X-DEC₂ can further be halved.

Thus, the bits of address signals for the three address decoder circuits can be distributed in a variety of ways. This fact can also ba adapted to the address decoder circuits of the Y-system that select data lines.

Further, the address decoder circuits may be constituted by complementary MOS circuits made up of p-channel MOSFET's and n-channel MOSFET's.

Although the foregoing description has dealt with the case in which the present invention was adapted to a dynamic RAM, the invention can also be adapted in the same manner to static RAM's or ROM's [inclusive of programmable ROM's (read-only memories)].

What is claimed is:

1. A semiconductor memory device comprising:
    a plurality of memory cells;
    control means which forms first, second and third select signals and a timing signal;
    first select means which receives said first select signals and produces fourth select signals for selecting a first predetermined number of memory cells designated by said first select signals from said plurality of memory cells;
    second select means which receives said second and fourth select signals and produces fifth select signals for selecting a second predetermined number of memory cells from the memory cells selected by said first selection means, the second predetermined number being less than said first predetermined number; and third select means which receives said third select signals, said timing signal and said fifth select signals and produces a sixth select signal for selecting at least one memory cell from the memory cells selected by said second selection means.

2. A semiconductor memory device according to claim 1, wherein said second select means includes a first decoder circuit which decodes said second select signals, and first switching elements which are controlled by signals produced by said first decoder circuit, and wherein said fourth select signals are supplied to input terminals of said first switching elements, and said fifth select signals are produced from output terminals of said first switching elements.

3. A semiconductor memory device according to claim 2, wherein said third select means includes second switching elements controlled by said fifth select signals, and a select circuit which receives said third select signals and said timing signal, and which generates seventh select signals to be supplied to input terminals of said second switching elements.

4. A semiconductor memory device according to claim 3, wherein said select circuit comprises a second decoder circuit for decoding said third select signals, and a driver which receives signals produced by said second decoder circuit and said timing signal, and which generates said seventh select signals to be supplied to the input terminals of said plurality of second switching elements.

5. A semiconductor memory device according to claim 4, wherein said driver has a plurality of third switching elements which receive said timing signal through their input terminals, and which are controlled by the signals produced by said second decoder circuit.

6. A semiconductor memory device according to claim 5, wherein each of said second switching elements is an insulated gate field-effect transistor, and wherein each of said third switching elements is an insulated gate field-effect transistor.

7. A semiconductor memory device according to claim 6, wherein each of said memory cells has an insulated gate field-effect transistor and a capacitor for storing data.

8. A semiconductor memory device according to claim 2, wherein said second select means has reference means that are connected to the output terminals of said first switching elements, and that supply a predetermined potential to said output terminals of said first switching elements when said fifth select signals have hot been produced from said output terminals of said first switching elements.

9. A semiconductor memory device according to claim 8, wherein said reference means includes insulated gate field-effect transistors which are respectively provided between the output terminals of said first switching elements and a point of predetermined potential.

10. A semiconductor memory device according to claim 9, wherein each of said first switching elements is an insulated gate field-effect transistor.

11. A semiconductor memory device comprising:
a memory array having a plurality of memory cells formed along rows and columns;
control means which generates first, second and third select signals, and a timing signal;
first select means which receives said first select signals and generates fourth select signals for indicating a first predetermined number of memory cell columns designated by said first selection signals from said memory array;
second select means which receives said second and fourth select signals and generates fifth select signals for indicating a second predetermined number of memory cell columns from the memory cell columns designated by said first selection means, the second predetermined number being less than said first predetermined number; and
third select means which receives said timing signal, and said third and fifth select signals and generates a sixth select signal for indicating at least one memory cell column from the memory cell columns designated by said second select means.

12. A semiconductor memory device according to claim 11, wherein said each of memory cell columns comprises a pair of data lines and a plurality of memory cells whose output terminals are coupled to one of said data lines.

13. A semiconductor memory device according to claim 12, further comprising a pair of common data lines and column switch means which is coupled between said memory array and said common data line and which receive said sixth select signal, and whereby said column switch means couples the data line pair in the memory cell column indicated by said sixth select signal with said common data line pair.

14. A semiconductor memory device according to claim 13, wherein said control means comprises a timing circuit for generating said timing signal, and address buffer means responsive to address signals and for generating said first, second and third select signals corresponding to said address signals.

15. A semiconductor memory device according to claim 13, wherein each of said memory cells comprises an insulated gate field-effect transistor having a control terminal, a first input-output terminal and a second input-output terminal coupled to said data line, and a capacitor coupled to said first input-output terminal of said insulated gate field-effect transistor.

16. A semiconductor memory device comprising:
a memory array having a plurality of memory cells formed along rows and columns;
control means for generating first, second and third select signals, and a timing signal;
first select means which receives said first select signals and generates fourth select signals for indicating a first predetermined number of memory cell rows designated by said first select signals from said memory array;
second select means which receives said second and fourth select signals and generates fifth select signals for indicating a second predetermined number of memory cell rows from the memory cell rows designated by said first select means, the second predetermined number being less than said first predetermined number; and
third select means which receives said timing signal, and said third and fifth select signals and generates a sixth select signal for indicating at least one memory cell row from the memory cell rows designated by said second select means.

17. A semiconductor memory device according to claim 16, wherein each of said memory cell rows comprises a word line and a plurality of memory cells whose control terminals are connected to said word line.

18. A semiconductor memory device according to claim 17, wherein the word lines of said memory array are coupled to said third select means so that said sixth select signal generated by said third select means is supplied to a word line to be selected from the word lines of said memory array.

19. A semiconductor memory device according to claim 18, wherein each of said memory cells comprises an insulated gate field-effect transistor having a gate electrode coupled to said word line, a first input-output terminal and a second input-output terminal, and a capacitor coupled to said first input-output terminal of said insulated gate field-effect transistor.

20. A semiconductor memory device comprising:
a memory array having a plurality of memory cells formed along rows and columns;
control means which generates first, second and third row select signals, first, second and third column select signals, and row and column timing signals;
first row select means which receives said first row select signals, and generates fourth row select signals for indicating a first predetermined number of memory cell rows designated by said first row select signals from said memory array;
second row select means which receives said second and fourth row select signals, and generates fifth row select signals for indicating a second predetermined number of memory cell rows from the memory cell rows designated by said first row select means, the second predetermined number being less than said first predetermined number;
third row select means which receives said third and fifth row select signals and said row timing signal, and generates a sixth row select signal for indicating at least one memory cell row from the memory cell rows designated by said second row select means;
first column select means which receives said first column select signals, and generates fourth column select signals for indicating a third predetermined number of memory cell columns designated by said first column select signals from said memory array;
second column select means which receives said second and fourth select signals, and generates fifth column select signals for indicating a fourth predetermined number of memory cell columns from the memory cell columns designated by said first column select means, the fourth predetermined number being less than said third predetermined number; and
third column select means which receives said third and fifth column select signals, and said column timing signal and generates a sixth column select signal for indicating at least one memory cell column from the memory cell columns designated by said second column select means.

21. A semiconductor memory device according to claim 20, wherein each of memory cell rows comprises a word line and a plurality of memory cells whose control terminal is connected to said word line, and wherein each of memory cell columns comprises a pair of data lines and a plurality of memory cells whose output terminals are connected to one of said data lines.

22. A semiconductor memory device according to claim 21, further comprising a pair of common data lines, output means coupled to said common data lines and column switch means connected between said common data lines and said memory array, wherein word lines of said memory array are coupled to said third row select means so that said sixth row select signal is supplied to a word line to be delected by said first, second and third row select signals from said memory array, and wherein said column switch means is coupled to said third column select means so that a pair of data lines to be selected by said first, second and third column select signals are coupled to said common data lines, whereby data of the memory cell selected by said first, second and third row select signals, and said first, second and third column select signals is supplied to said output means.

23. A semiconductor memory device according to claim 22, wherein each of said memory cells comprises an insulated gate field-effect transistor having a gate electrode coupled to said control terminal, a first input-output terminal coupled to said output terminal and a second input-output terminal, and a capacitor coupled to said second input-output terminal of said insulated gate field-effect transistor.

* * * * *